US005689122A

United States Patent [19]

Chandrasekhar

[11] Patent Number: 5,689,122

[45] Date of Patent: Nov. 18, 1997

[54] INP/INGAAS MONOLITHIC INTEGRATED DEMULTIPLEXER, PHOTODETECTOR, AND HETEROJUNCTION BIPOLAR TRANSISTOR

[75] Inventor: S. Chandrasekhar, Matawan, N.J.

[73] Assignee: Lucent Technologies Inc., Murray Hill, N.J.

[21] Appl. No.: 514,707

[22] Filed: Aug. 14, 1995

[51] Int. Cl.$^6$ .................. H01L 31/0328; H01L 31/0336; H01L 31/072; H01L 31/109

[52] U.S. Cl. .......................... 257/184; 257/197; 257/432; 257/458

[58] Field of Search .................................... 257/458, 187, 257/192, 195, 197, 198, 184, 432

[56] References Cited

U.S. PATENT DOCUMENTS

| | | | |
|---|---|---|---|
| 5,002,350 | 3/1991 | Dragone | 350/96.15 |
| 5,063,426 | 11/1991 | Chandrasekhar | 357/30 |
| 5,136,671 | 8/1992 | Dragone | 385/46 |
| 5,557,117 | 9/1996 | Matsuoka et al. | 257/184 |

FOREIGN PATENT DOCUMENTS

| | | |
|---|---|---|
| 6384150 | 4/1988 | Japan . |
| 6326120 | 11/1994 | Japan . |

OTHER PUBLICATIONS

Y. Kanabar and N. Baker "Demonstration of Novel Optical Multichannel Grating Demultiplexer Receiver (MGD) for HDWDM Systems" *Electronics Letters,* Jun. 22, 1989, vol. 25, No. 13, pp. 817–819.

S. Chandrasekhar et al. "Monolithic Integrated Waveguide Photodetector", *Electronics Letters,* May 7, 1987, vol. 23, No. 10, pp. 501–502.

M. R. Amersfoort et al. "Low-Loss Phased-Array Based 4-Channel Wavelength Demultiplexer Integrated with Photodetectors", *IEEE Photonics Technology Letters,* vol. 6, No. 1, Jan. 1994, pp. 62–64.

J.-M. Verdiell et al. "A WDM Receiver Photonic Integrated Circuit with Net On-Chip Gain", *IEEE Photonics Technology Letters,* vol. 6, No. 8, Aug. 1994, pp. 960–962.

S. Chandrasekhar et al. "Integrated Waveguide p-i-n Photodetector by MOVPE Regrowth", *IEEE Electron Device Letters,* vol. EDL-8, No. 11, Nov. 1987, pp. 512–514.

M. R. Amersfoort et al "8×2nm Polarization-Independent WDM Detector Based on Compact Arrayed Waveguide Demultiplexer" *Technical Digest of the Integrated Photonics Research Conference,* Feb. 1995, Dana Point, California, pp. PD3-1–PD3-2.

*Primary Examiner*—William Mintel
*Attorney, Agent, or Firm*—S. H. Mayer; S. Bartholomew; B. Dinicola

[57] ABSTRACT

The present invention relates to a monolithic integrated demultiplexing photoreceiver that is formed on a semi-insulating InP substrate. A frequency routing device is formed on the substrate and includes a first plurality of In/InGaAs semiconductor layers. At least one p-i-n photodiode is also formed on the substrate and includes a second plurality of InP/InGaAs semiconductor layers. Additionally, at least one single heterostructure bipolar transistor is formed on the substrate and includes a third plurality of InP/InGaAs semiconductor layers. At least one layer from each of the first, second and third plurality of layers are substantially identical to one another.

14 Claims, 3 Drawing Sheets

HBT PREAMPLIFIERS
100
12
14
$V_0(\lambda_1)$
$V_0(\lambda_8)$
$4_1$
$4_2$
$4_k$
35
33
46
32
98
95
$2_1$
$2_2$
$2_i$
10
OPTICAL INPUT ($\lambda_2,...\lambda_8$)

INP/INGAAS MONOLITHIC INTEGRATED DEMULTIPLEXER, PHOTODETECTOR, AND HETEROJUNCTION BIPOLAR TRANSISTOR

TECHNICAL FIELD

The present invention relates to semiconductor devices, and in particular, to semiconductor devices having an integrated demultiplexer, photodetector and amplifier.

BACKGROUND OF THE INVENTION

With the rapid development of lightwave communications, low cost, high performance optical receivers are needed for a variety of systems applications. Silica fibers in the long wavelength range (1.3–1.6 microns) have relatively low attenuation and accordingly, a high degree of interest has been generated by integrated optical receivers which operate in this spectral range.

A monolithic photoreceiver that integrates a photodetector and a heterojunction bipolar transistor is disclosed in U.S. Pat. No. 5,063,426. While this configuration allows the photonics and electronics to be separately optimized while maintaining materials compatibility, it fails to integrate a demultiplexer, which is used in wavelength division multiplexed communication systems to resolve the multiplexed channels prior to detection and amplification. The integration of the demultiplexing and detection functions offer a number of advantages, including automatic optical alignment, reduced number of required components, improved reliability and reduced cost. Accordingly, it is desirable to provide a photoreceiver that integrates a photodetector, heterojunction bipolar transistor and a demultiplexer.

SUMMARY OF THE INVENTION

The present invention relates to a monolithic integrated demultiplexing photoreceiver that is formed on a semi-insulating InP substrate. A frequency routing device is formed on the substrate and includes a first plurality of InP/InGaAs semiconductor layers. At least one p-i-n photodiode is also formed on the substrate and includes a second plurality of InP/InGaAs semiconductor layers. Additionally, at least one single heterostructure bipolar transistor is formed on the substrate and includes a third plurality of InP/InGaAs semiconductor layers. At least one layer from each of the first, second and third plurality of layers are substantially identical to one another. In one embodiment, this layer is a common $n^+$InGaAsP layer serving as the waveguide core of the frequency routing device and as the n-contact layer for both the p-i-n photodiode and single heterojunction bipolar transistor. The common $n^+$InGaAsP layer may be disposed on an $n^-$InP layer serving as the lower cladding layer of the frequency routing device.

DETAILED DESCRIPTION

Figure 1:
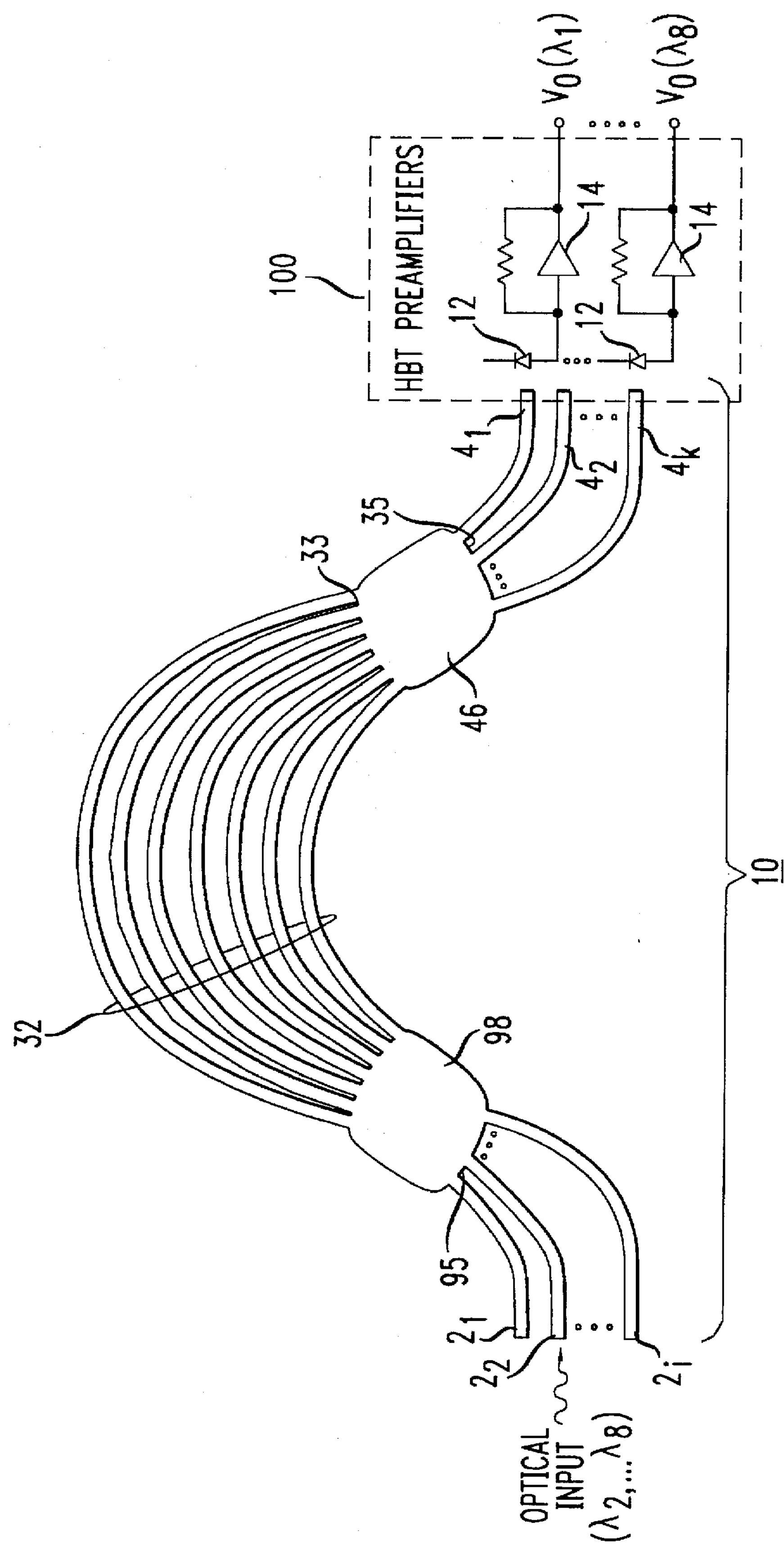
FIG. 1 shows a schematic diagram of a monolithic integrated demultiplexing photoreceiver in accordance with the present invention.

In accordance with the present invention, a monolithic integrated demultiplexing photoreceiver comprising a frequency routing device, a p-i-n photodiode and a heterostructure bipolar transistor (HBT) has been realized in the InP/InGaAs material system. As shown in FIG. 1, frequency routing device 10 contains a plurality of input waveguides $2_i$, i=1, 2, . . . , N connected to the input circle 95 of a free space region 98. An optical grating 32 extends from the output circle 97 of the free space region 98 and is connected to an optical grating 32. The optical grating 32 comprises a plurality of unequal length waveguides which provides a predetermined amount of path length difference to optical signals propagating therein. The optical grating 32 is connected to the input circle 33 of another free space region 46. The output circle 35 of the free space region 46 is connected to a plurality of output waveguides $4_k$, k=1, 2, . . . , N. The frequency routing device spectrally resolves a wavelength-multiplexed signal appearing at any of its input waveguides by directing each wavelength to a distinct output waveguide. Additional details concerning these routing devices may be found in U.S. Pat. Nos. 5,002,350 and 5,136,671, for example.

An optical wavelength appearing on an output waveguide of the frequency routing device 10 is detected and amplified by a photoreceiver 100 situated adjacent to the each output waveguide. That is, each output waveguide of the frequency routing device 10 is associated with a distinct photoreceiver 100. Each photoreceiver 100 includes a p-i-n photodiode 12 and an amplifier 14. The amplifier 14 comprises one or more HBTs.

In the present invention, the frequency routing device, p-i-n photodiode and HBT have semiconductor layers selected from the InP/InGaAs material system which are grown over a semi-insulating InP substrate. Standard fabrication techniques including metalorganic vapor phase epitaxy (MOVPE), selective wet chemical etching, reactive ion etching, and contact metalization are used to fabricate a device in accordance with the principles of the invention. These fabrication techniques are well-known to persons of ordinary skill in the art and, thus, are not discussed in detail here.

Figure 2:
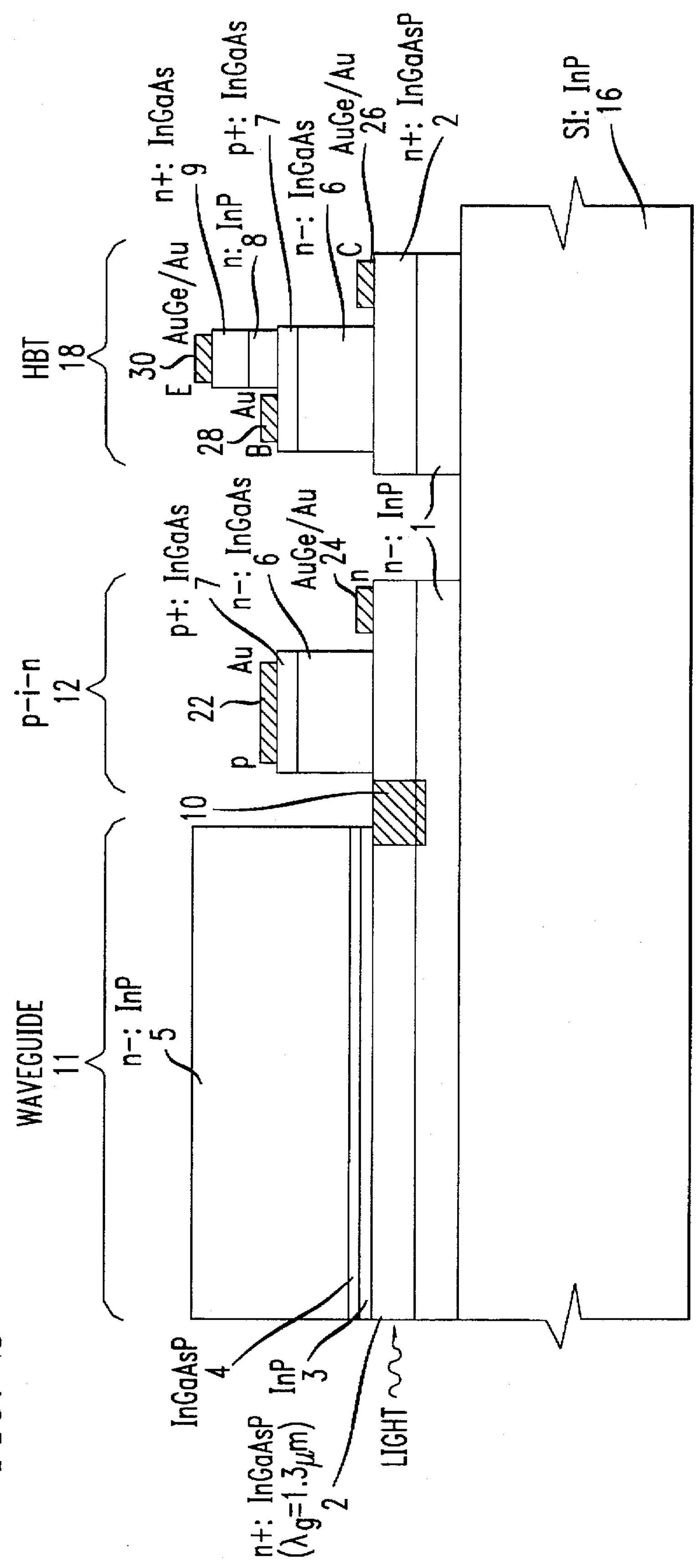
FIG. 2 schematically depicts a cross-sectional view of the demultiplexing photoreceiver shown in FIG. 1.

FIG. 2 schematically depicts a cross-sectional view of the monolithic demultiplexing photoreceiver in accordance with the principles of the invention. The figure shows a single one of the waveguides 11 constituting the frequency routing device, along with its associated p-i-n photodiode 12 and HBT 18. The exemplary embodiment is grown on an Fe doped InP substrate 16. The frequency routing device epilayers comprise lower cladding layer 1 ($n^-$InP), waveguide core layer 2 ($n^+$InGaAsP), stop-etch layer 3 (InP), strip-loading layer 4 (InGaAsP) and upper cladding layer 5 ($n^-$InP). It will be recognized by those of ordinary skill in the art that while the exemplary frequency routing device incorporates a buried rib waveguide structure, any other type of waveguide structure may be alternatively used.

The p-i-n photodiode 12 comprises an absorber layer 6 ($n^-$InGaAs) and p-contact layer 7 ($p^+$InGaAs). The absorber layer 6 is situated over the waveguide core layer 2, which serves as the n-contact layer of the p-i-n photodiode 12. The HBT 18 is a single heterojunction bipolar transistor (SHBT) in which the collector and base are formed from the same materials so that a homojunction is formed therebetween. The SHBT 18 comprises collector layer 6, base layer 7, emitter layer 8 (n InP), and emitter contact layer 9 ($n^+$In GaAs). Just as for the p-i-n photodiode 12, the waveguide core layer 2 serves as the SHBT subcollector.

The demultiplexing photoreceiver shown in FIG. 2 was fabricated in only three epitaxial growth steps. In the first step, lower cladding layer 1, waveguide core layer 2, stop etch layer 3 and strip loading layer 4 were epitaxially grown on substrate 16. Wet chemical etching was then performed to define the rib in the strip loading layer 4. In the second epitaxial growth step, the upper cladding layer 5 was grown to bury the rib, completing the buried-rib waveguide structure. An $SiO_2$ mask was next deposited over the completed waveguide portion of the substrate constituting the frequency routing device so that strip loading layer 4 and upper cladding layer 5 could be etched away from the remainder of the substrate. With the $SiO_2$ mask still in place, the p-i-n photodiode 12 and SHBT 18 were fabricated in the third epitaxial growth step by growing collector 6, base layer 7, emitter layer 8 and emitter contact layer 9. Wet etching was then performed to realize the mesa structures of both the p-i-n photodiode 12 and SHBT 18. An electrically isolating region 10 comprising Fe, for example, was implanted in the waveguide core layer 2 between the routing device and p-i-n photodiode 12. The region 10 electrically isolates the p-i-n photodiodes 12 from one another. If electrically isolating region 10 were not present, the photodiodes could electrically communicate with one another via the waveguides of the frequency routing device. The implantation procedure was performed so that a highly resistive region 10 results without unduly increasing scattering losses in the waveguides of the frequency routing device. After implantation the device was annealed at 300° C. for 10 minutes. Conventional metal contacts such as AuGe/Au and Au were deposited on the flat surfaces of the mesas in order to provide ohmic contacts 22, 24, 26, 28 and 30. Passivation of the resulting demultiplexing photoreceiver was accomplished by depositing polyimide over the entire device.

As detailed above, the invention advantageously integrates a frequency routing device, p-i-n photodiode, and HBT by carefully selecting device structures that are compatible with one another so that at least one of the layers in each device is also used in the other devices. Specifically, the particular HBT that is selected is an SHBT so that the homojunction formed by its collector and base layers also serves as the absorber and p-contact layers of the p-i-n photodiode. Consequently, both the SHBT and the p-i-n photodiode may be formed during the same series of epitaxial depositions. Moreover, by employing a frequency routing device having a core layer formed from an $n^+$ doped material (rather than an undoped material, which is more commonly used), the core layer also functions as the subcollector layer for both the p-i-n photodiode and the SHBT as well. The optical properties of the waveguide are not substantially affected by using an $n^+$ doped core material rather than an undoped material.

Figure 3:
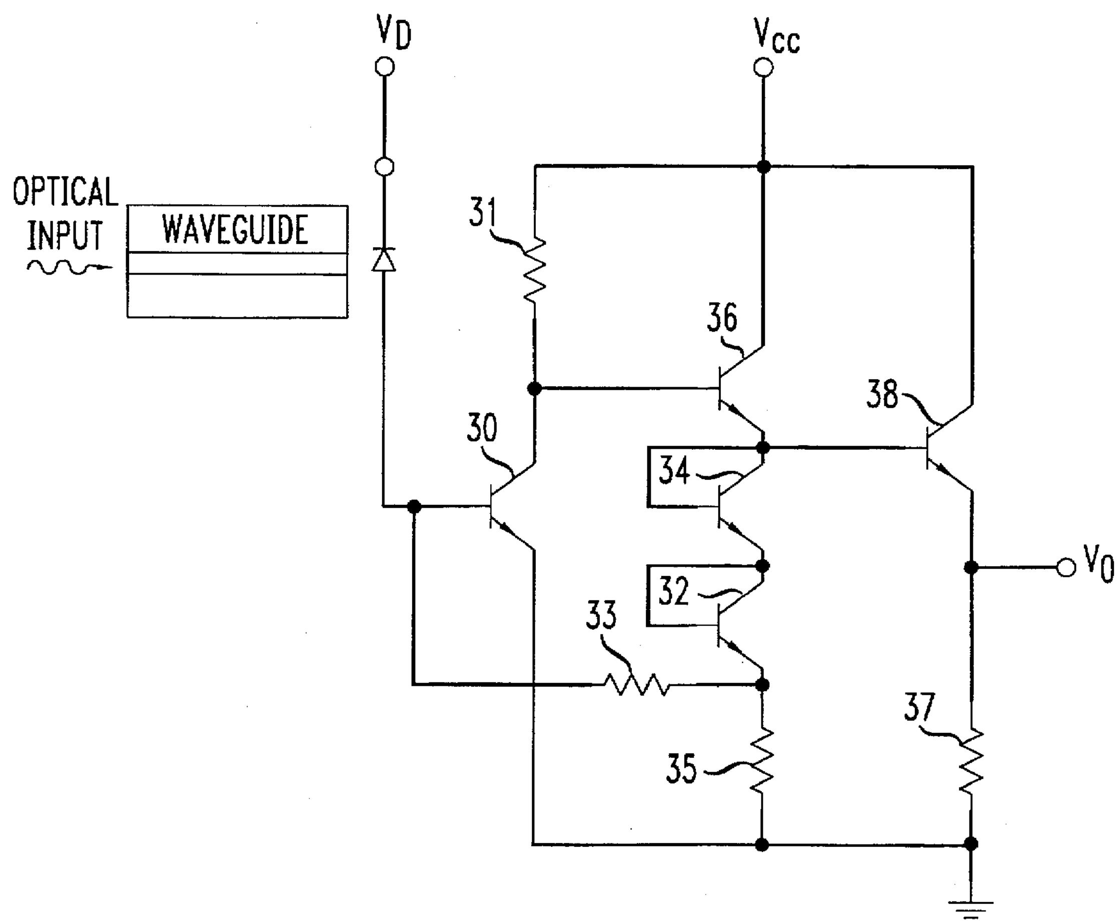
FIG. 3 shows an exemplary amplifier circuit that may be used in the present invention.

FIG. 3 shows one example of an amplifier circuit that may be used in the present invention. The circuit has a transimpedance configuration comprising five SHBTs 30, 32, 34, 36, and 38 each having the structure shown in FIG. 2 and four resistors 31, 33, 35, and 37 for biasing and feedback. Additional details concerning the amplifier circuit may be found in U.S. Pat. No. 5,063,426. One of ordinary skill in the art will recognize that the invention is not limited to the particular amplifier configuration shown in FIG. 3. Rather, any appropriate circuit may be chosen based on the particular application for which it is intended.

I claim:

1. A monolithic integrated demultiplexing photoreceiver comprising:
   - a semi-insulating InP substrate;
   - a frequency routing device formed on said substrate including a first plurality of InP/InGaAs semiconductor layers;
   - at least one p-i-n photodiode formed on said substrate including a second plurality of InP/InGaAs semiconductor layers;
   - at least one single heterostructure bipolar transistor formed on said substrate including a third plurality of InP/InGaAs semiconductor layers, at least two layers of said first, second, and third plurality of layers being substantially identical to one another.

2. The photoreciever of claim 1 wherein said second and third pluralities of semiconductor layers include an In GaAs collector layer and an InGaAs base layer.

3. The photoreceiver of claim 2 wherein said first, second, and third pluralities of layers includes a common n+ InGaAsP layer serving as a waveguide core for said frequency routing device and as an n− contact layer for said p-i-n photodiode and said single heterojunction bipolar transistor.

4. The photoreceiver of claim 3 wherein said common $n^+$InGaAsP layer is disposed on an $n^-$InP layer serving as a lower cladding layer for said frequency routing device.

5. The photoreceiver of claim 2 wherein said common InGaAs collector layer is doped n-type and said common InGaAs base layer is doped p-type.

6. The photoreceiver of claim 3 wherein said third plurality of layers includes an InP emitted layer disposed on said common InGaAs base layer.

7. The photoreceiver of claim 4 wherein said third plurality of layers includes an InP emitter layer disposed on said common InGaAs base layer.

8. The photoreceiver of claim 3 further comprising an electrically isolating region disposed in said common $n^+$InGaAsP layer between said frequency routing device and said p-i-n photodiode.

9. The photoreceiver of claim 4 further comprising an electrically isolating region disposed in said common $n^+$InGaAsP layer between said frequency routing device and said poi-n photodiode.

10. The photoreceiver of claim 8 wherein said electrically isolating region comprises Fe implanted in said common $n^+$InGaAsP.

11. The photoreceiver of claim 6 wherein said third plurality of layers further includes an InGaAs emitter contact layer disposed on said InP emitter layer.

12. The photoreceiver of claim 1 further comprising a plurality of single heterojunction bipolar transistors formed on said substrate, said plurality of single heterojunction bipolar transistors being arranged in an amplifier configuration.

13. The photoreceiver of claim 1 wherein said frequency routing device has a plurality of output waveguides and further comprising a plurality of p-i-n photodiode and single heterojunction bipolar transistor pairs formed on said substrate, each of said output waveguides having associated therewith one of said p-i-n photodiode and single heterojunction bipolar transistor pairs.

14. The photoreceiver of claim 1 wherein said frequency routing device comprises:
    - a plurality of input waveguides;
    - a first free space region connected to the plurality of input waveguides;
    - an optical grating connected to the first free space region and comprising a plurality of unequal length waveguides;
    - a second free space region connected to the optical grating; and
    - a plurality of output waveguides connected to the second free space region.

* * * * *

UNITED STATES PATENT AND TRADEMARK OFFICE

CERTIFICATE OF CORRECTION

PATENT NO. : 5,689,122
DATED : November 18, 1997
INVENTOR(S) : S.Chandrasekhar

It is certified that error appears in the above-identified patent and that said Letters Patent is hereby corrected as shown below:

Column 1,
Line 3, after the Title insert
-- ACKNOWLEDGEMENT OF GOVERNMENTAL RIGHTS This invention was made with Government support under Agreement No. MDA 972-94-3-0036 awarded by ARPA. The Government has certain rights in the invention. --

Signed and Sealed this

Twenty-seventh Day of November, 2001

*Attest:*

Nicholas P. Godici

NICHOLAS P. GODICI

*Attesting Officer* *Acting Director of the United States Patent and Trademark Office*